United States Patent
Hogan et al.

(12)

(10) Patent No.: US 6,175,503 B1
(45) Date of Patent: Jan. 16, 2001

(54) INTERCONNECTION SYSTEM FOR RACK MOUNTED RECTIFIER

(75) Inventors: Gerald Michael Hogan, Mesquite; Steven Jeffery Marzec; Lyle James Ratner, both of Dallas, all of TX (US)

(73) Assignee: ADS, The Power Resource, Inc., Dallas, TX (US)

( * ) Notice: Under 35 U.S.C. 154(b), the term of this patent shall be extended for 0 days.

(21) Appl. No.: 09/179,784

(22) Filed: Oct. 27, 1998

(51) Int. Cl.$^7$ .................................................. H05K 7/00
(52) U.S. Cl. .................. 361/733; 361/614; 361/827; 312/349
(58) Field of Search ................................. 361/601, 614, 361/641, 728, 729, 733, 756, 802, 741, 826, 827; 363/144; 211/70.1; 220/4.02; 312/349, 223.1

(56) References Cited

U.S. PATENT DOCUMENTS

| | | | |
|---|---|---|---|
| 4,967,311 | * | 10/1990 | Ferchau et al. ....................... 361/686 |
| 5,132,872 | * | 7/1992 | Hase ...................................... 361/692 |
| 5,764,504 | * | 6/1998 | Brand et al. .......................... 363/144 |

* cited by examiner

*Primary Examiner*—Jayprakash N. Gandhi
(74) *Attorney, Agent, or Firm*—Howison, Chauza, Handley & Arnottl, L.L.P.

(57) ABSTRACT

An interconnect for engaging a rectifier module with a rectifier cabinet has a first portion which includes AC output contacts, DC input contacts, a cabinet data signal connector and sidewalls which define an enclosed space of the rectifier cabinet. A second portion of the interconnect includes DC output contacts, AC input contacts, a module pin data signal connector and a housing which encloses a rectifier unit. A guide member is mounted to one of the first and second portions of the interconnect. A guide member hole is included with the other of the first and second portions of the interconnect for engaging with the guide member to align the first portion of the interconnect with the second portion of the interconnect. A pair of guide pins are mounted to one of the data signal connectors for engaging within sockets of the other of the data signals connectors for aligning the data signal connectors. One of the data signal connectors is moveably attached to a respective one of the rectifier module housing and the rectifier cabinet for moving to matingly engage with the other of the data signal connectors. Inserting the rectifier module within the rectifier cabinet engages the housing of the rectifier module with the sidewalls of cabinet, which aligns the guide member for engagement within a guide member hole to align the DC input and output connectors, the AC input and output connectors and the data signal connectors.

20 Claims, 5 Drawing Sheets

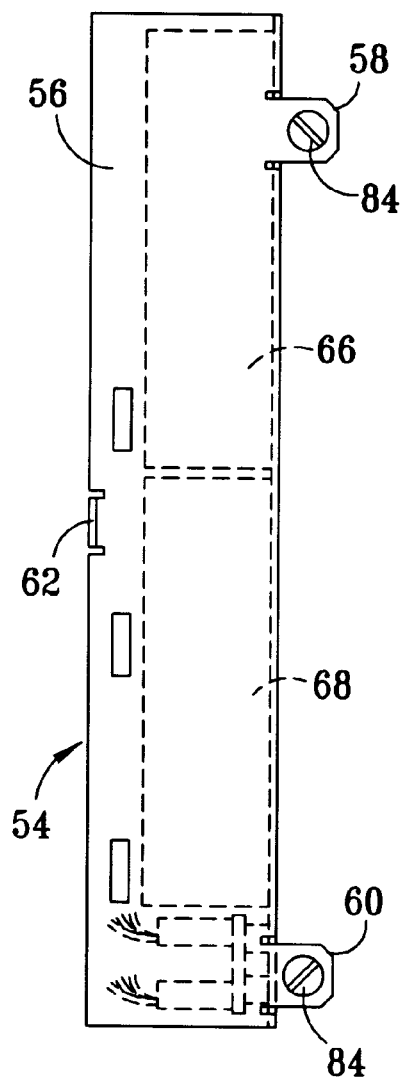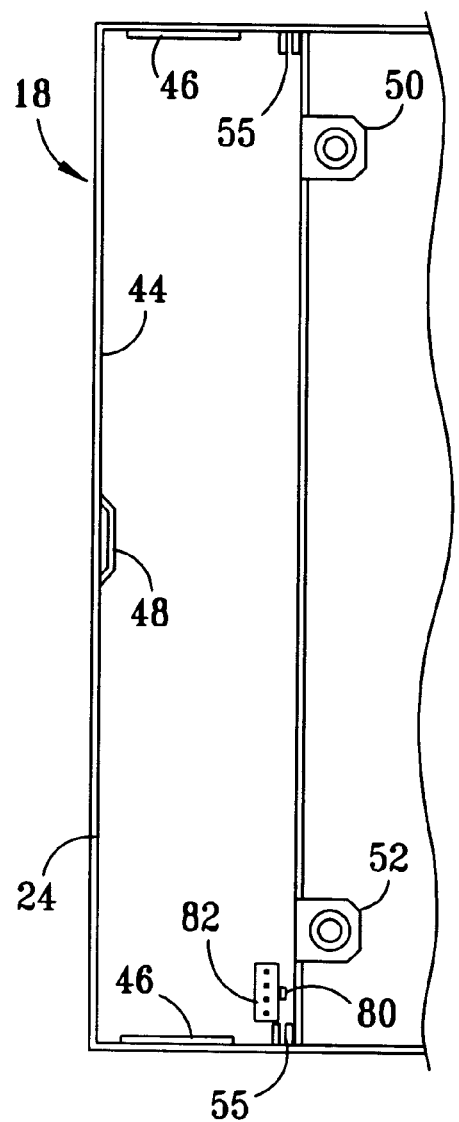

INTERCONNECTION SYSTEM FOR RACK MOUNTED RECTIFIER

CROSS REFERENCE TO RELATED APPLICATIONS

This application is related to U.S. patent application Serial No. 09/179,785, entitled, "REMOVABLE FAN FOR RACK MOUNTED RECTIFIERS" filed Oct. 27, 1998 now U.S. Pat. No. 6,075,698.

TECHNICAL FIELD OF THE INVENTION

The present invention relates in general to rack mounted rectifiers, and in particular to an interconnection system for rack mounted rectifiers.

BACKGROUND OF THE INVENTION

Prior art rack mounted rectifiers have been provided for mounting in rectifier cabinets. Such rectifiers have AC inputs and DC outputs. Rectifier cabinets have found extensive use in the rapidly expanding telecommunications industry, providing power for telephone switch gear and the like. Rectifier cabinets have been provided of modular design, in which rectifier modules were removably mounted within the cabinets. Typically, the rectifier modules may be "hot swapped;" that is, a portion of the rectifiers may be removed from the rectifier cabinets without having to shut down the entire cabinet such that power may be maintained by the equipment powered by the rectifier cabinet being serviced.

The mounting of rectifier modules within rectifier cabinets requires the proper alignment of various AC input and DC output contacts, and various signal connectors to enable operation of the rectifier modules. Once the modules are aligned and properly inserted into the racks of the rectifier cabinets, they are secured in place by a latch such that they cannot be removed from the cabinets while the latch is secured. Additional space is taken up by the latching mechanism and alignment members which are utilized for installing prior art rectifier modules into prior art rectifier cabinets. The industry for power equipment has generated predetermined modular unit sizes for determining the space utilized for modular rectifier components. The usage of additional space for alignment members and latching mechanisms prevents the size of rectifier cabinets from being reduced to more compact sizes.

SUMMARY OF THE INVENTION

The present invention disclosed and claimed herein comprises and interconnect for engaging a rectifier module with a rectifier cabinet. A first portion of the interconnect includes AC output contacts, DC input contacts, a cabinet data signal connector and sidewalls which define an enclosed space of the rectifier cabinet. A second portion of the interconnect includes DC output contacts, AC input contacts, a module pin data signal connector and a housing which encloses a rectifier unit. A guide member is mounted to one of the first and second portions of the interconnect. A guide pin member hole is included with the other of the first and second portions of the interconnect for engaging with the guide pin member to align the first portion of the interconnect with the second portion of the interconnect for proper mating of the input and output contacts and the data signal connectors. A pair of data signal connector guide pin members are mounted to one of the data signal connectors for engaging within guide pin sockets of the other of the data signals connectors for aligning the data signal connectors for a mating engagement therebetween. One of the data signal connectors is moveably attached to a respective one of the rectifier module housing and the rectifier cabinet for moving to matingly engage with the other of the data signal connectors, which is rigidly attached to the respective one of the module or cabinet. Inserting the rectifier module within the partially enclosed space of the rectifier cabinet engages the housing with the sidewalls of the partially enclosed spaced, which aligns the guide member for engagement within a guide member hole to align the DC input and output connectors, the AC input and output connectors, and the data signal connectors in mating engagements.

In another aspect of the present invention, the guide pin members are mounted to the data signal connectors which are mounted to the cabinet, and the guide pin holes are mounted to the data signal connectors which are mounted to the housings of the rectifier modules.

In another aspect of the present invention, one of the sidewalls of the partially enclosed spaces of the rectifier cabinet has a slot disposed in the forward portion for receiving a latch member which is movably mounted to the housing of the rectifier module. The latch member is sized such that it will fit flush with an opposite side of the sidewall having the slot that on which the respective rectifier module is disposed. The latch member is moveable for extending and retracting in lineal directions.

In another aspect of the present invention, the one of the sidewalls having the slot formed therein is defined by a singular sheet of metal. The forward end of the singular sheet of metal is folded over into a doubled layer at the forward portion thereof in which the slot is disposed for receiving the latch member of the rectifier module.

BRIEF DESCRIPTION OF THE DRAWINGS

For a more complete understanding of the present invention and the advantages thereof, reference is now made to the following description taken in conjunction with the accompanying Drawings in which:

FIG. 6 illustrates a right side elevational view of the fan module;

FIG. 7 illustrates a partial, side elevational view of the housing of the rectifier module;

DETAILED DESCRIPTION OF THE INVENTION

Figure 1:
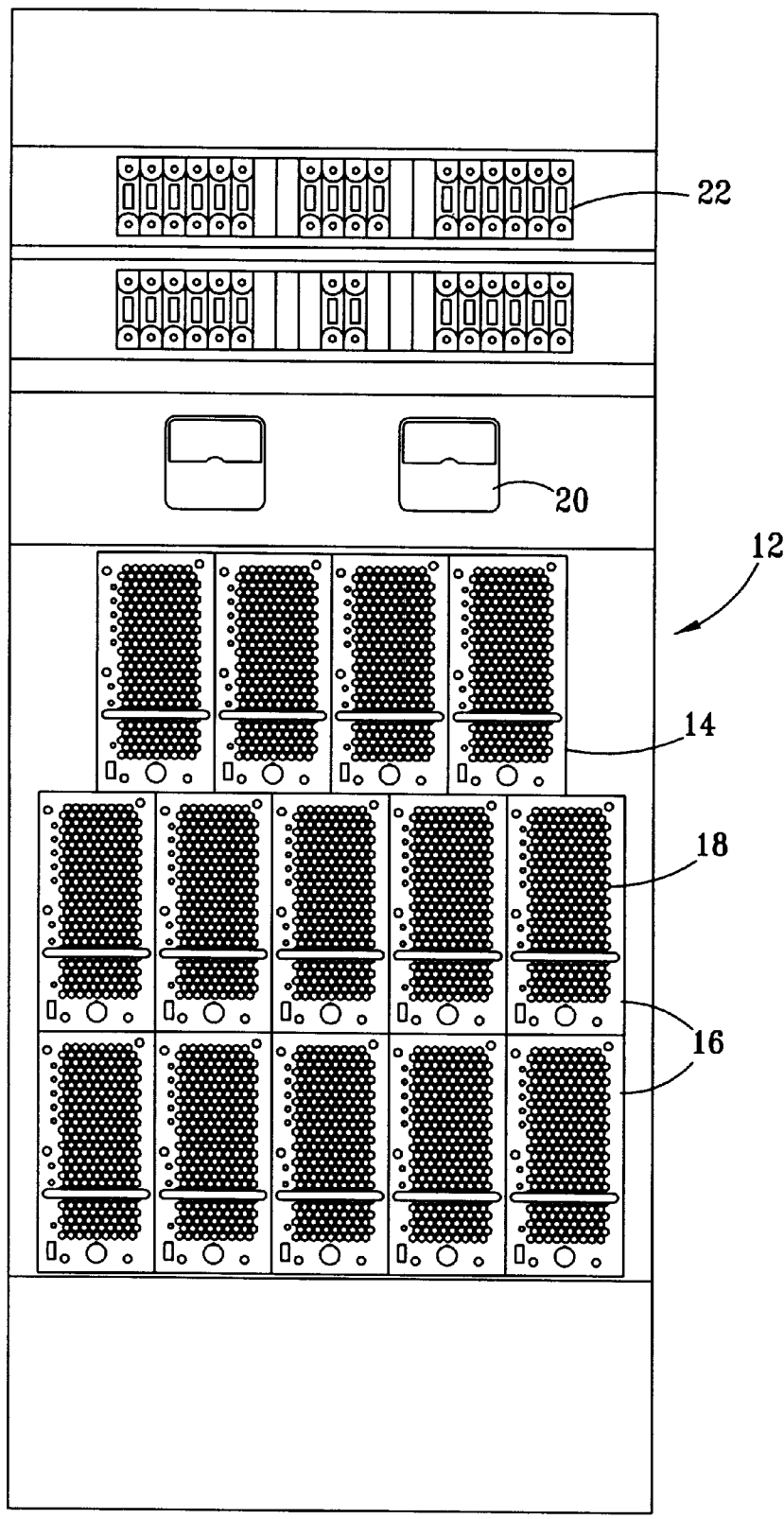
FIG. 1 illustrates a front, perspective view of a rectifier cabinet made according to the present invention.

Referring now to FIG. 1, there is illustrated a front, elevational view of a rectifier cabinet 12. The rectifier cabinet 12 includes a plurality of rectifier panels 14 and rectifier panels 16, within which rectifier modules 18 are mounted. Preferably, each of the rectifier panels 14 will receive four of the rectifier modules 18, and each of the rectifier panels 16 will receive five of the rectifier modules 18. Cabinet gauges 20 are provided for monitoring the voltage and the current output of the rectifier cabinet 12. A plurality of power circuit breakers 22 are provided at the top of the rectifier cabinet 12.

Figure 2:
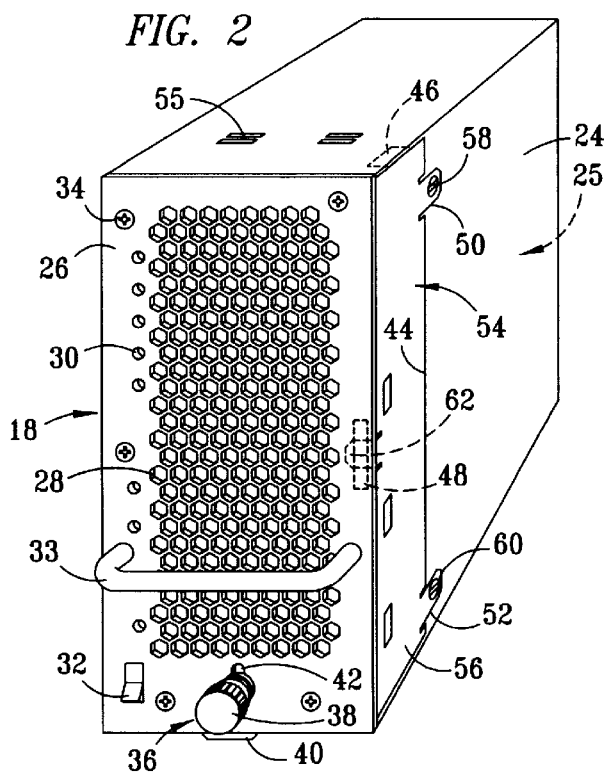
FIG. 2 illustrates a frontal, perspective view of one of the rectifier modules.

Referring now to FIG. 2, there is illustrated a frontal, perspective view of one of the rectifier modules 18. The rectifier module 18 includes a housing 24, which encloses a rectifier unit 25. The housing 24 has a front plate 26 which is preferably perforated by a plurality of honeycomb-shaped perforations 28 that provide air flow ports for cooling the interior of the module 18. A plurality of LEDs are disposed on the left side of the front plate 26 of the rectifier module 18 and provide output signal indicators 30. A main power switch 32 is disposed on the lower left of the front plate 26. A handle 33 is provided by a round rod which is U-shaped and mounted to extend forward of the front plate 26. A latch 36 includes a knob 38 and a latch plate 40, which provides a latch member. The knob 38 is fastened to the latch plate 40 by a threaded bolt which slides within the vertical slot 42. The knob 38 is rotated clockwise to grip the front plate 26 between the latch plate 40 and the knob 38. The knob 38 is rotated counterclockwise such that the knob 38 and latch plate 40 will slide within the vertical slot 42 of the front plate 26. The knob 38 and the latch plate 40 may be pulled upwards until the bottom of the latch plate 40 is flush with the bottom of the front plate 26 and the bottom of the housing 24, which is herein defined as the unlatched position for the latch 36.

The housing 24 of the rectifier module 18 has an opening 44. Two notches 46 (one shown) are provided at the top and bottom, respectively, of the opening 44. A strap 48 is defined by recesses formed into the side surface of the module 18, rearward of the front plate 26 of the housing 24. Notches 50 and 52 are defined on the rearward side of the opening 44 by the recesses formed into the surface of the module 18. The opening 44 is sized for receiving a removable fan module 54. The fan module 54 is removably mounted to the rectifier module 18 such that a failed fan module 54 may be replaced without requiring replacement of the entire rectifier module 18. Four pairs of indentations 55 (two shown) are formed into the top and bottom outer surfaces of the housing 24 to provide inwardly extending protuberances which provide guides for receiving a portion of the fan module 54.

Figure 3:
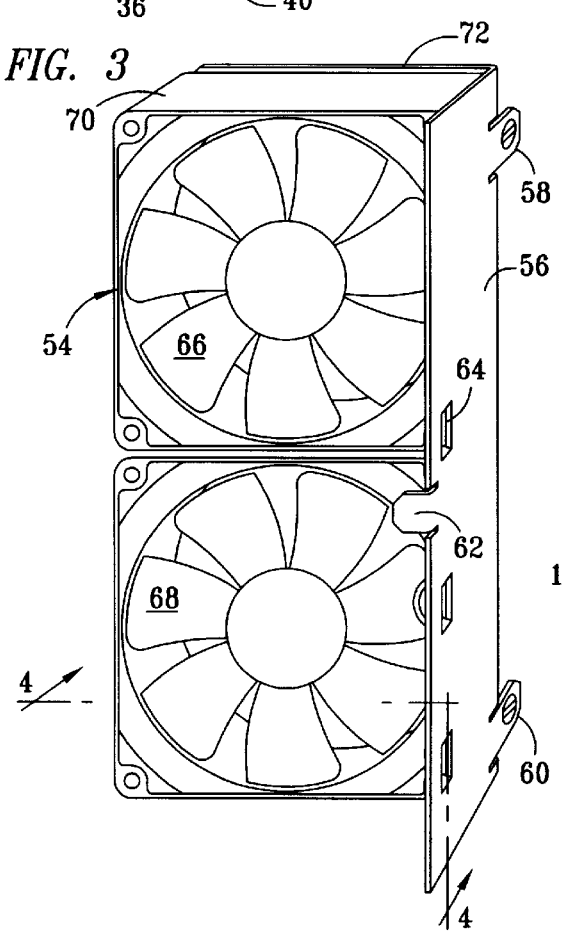
FIG. 3 illustrates a frontal perspective view of the fan module.

Referring now to FIG. 3, there is illustrated a frontal, perspective view of the fan module 54. The fan module 54 includes a side plate 56, which is received between the pairs of indentations 55 to align the fan module 54 during insertion into the socket 44. The side plate 56 includes tab 58, tab 60 and tab 62. The fan module 54 includes the holes 64 which are formed into the side plate 56. Two fan units 66 and 68 are mounted to the fan module 54, each including fan blades and an electric fan motor. A sidewall 70 extends around three sides of the fans 66 and 68. A back plate 72 is provided with two holes which are preferably sized full bore with respect to the fans 66 and 68.

Figure 4:
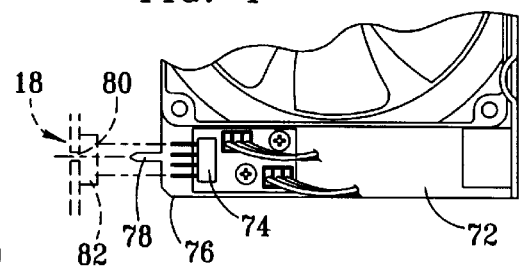
FIG. 4 illustrates a partial cut-away view of the fan module, showing the lower portion of the back plate.

Referring now to FIG. 4, there is illustrated a partial cut-away view of the fan module 54, showing the lower portion of the back plate 72 in more detail. The back plate 72 has an electrical connector 74 mounted thereto. The connector 74 has power contacts 76. A guide pin 78 is integrally formed as a singular member with the back plate 72, and for mating with a guide hole 80 mounted to the housing 24 of the rectifier module 18. An electrical connector 82 is also mounted within the housing 24 of the rectifier module 18, and has contacts for engaging the contacts 76 of the connector 74 to electrically connect the fan module 54 to the rectifier module 18.

Figure 5:
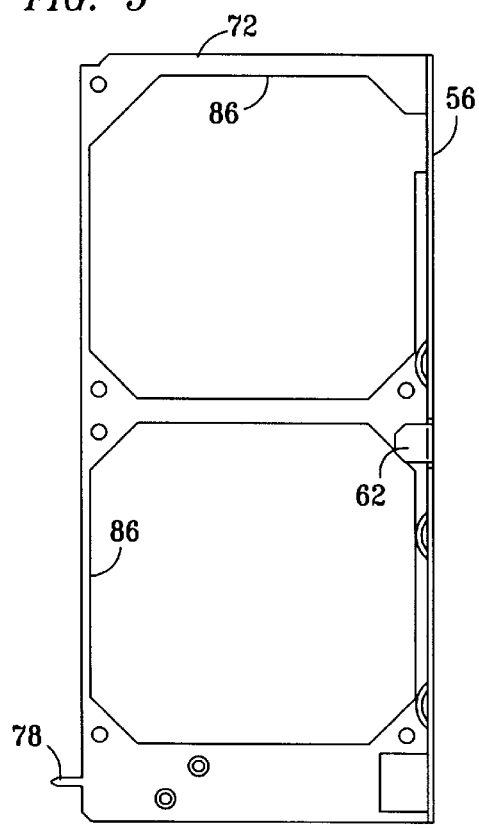
FIG. 5 illustrates a frontal elevation view of a back plate and a side plate of the mounting bracket for the fan module.

Referring now to FIG. 5, there is illustrated a frontal elevation view of a back plate 72 and a side plate 56. The guide pin 78 is shown as extending from the side of the back plate 78, being formed from an edge of the back plate 72. Preferably, the guide pin 78 and the back plate 72 are machined from a single, flat sheet of aluminum. Two apertures 86 are cut into the back plate 72 for aligning and registering with the fans 66 and 68 (shown in FIG. 3).

Referring now to FIG. 6, there is illustrated a side elevational view of the fan module 54. The tabs 58 and 60 are shown having two captured screws 84. The tab 64 is bent over a right angle for engaging within the strap 48 of the front plate 26 (shown in FIG. 2). The tabs 58 and 60 will fit within the notches 50 and 52 formed into the housing 24, with the outward sides of the tabs 58, 60 and the face plate 56 fitting flush with the side of housing 24.

Referring now to FIG. 7, there is illustrated a partial side elevational view of the housing 24 of the rectifier module 18. The notches 46 are depicted on the top and bottom of the opening 44. The opening 44 provides a socket for receiving the fan module 54. The strap 48 is shown for receiving the tab 62 of the fan module 54. Also depicted is the connector 82 having the guide hole 40 for receiving the guide pin 78 of the back plate 72, which provides a mounting bracket of the fan module 54. The protuberances provided by the indents 55 provide pairs of guide tabs for receiving the edges of the top and bottom of the back plate 72, for aligning the connector 74 and the guide pin 78 for being received in respective ones of the connector 82 and the guide hole 80.

Figure 8:
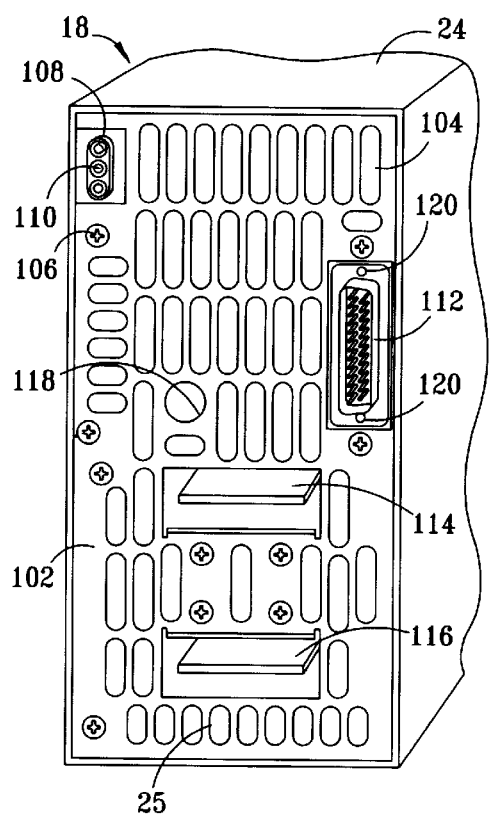
FIG. 8 illustrates a partial, perspective view of the rearward end of the rectifier module.

Referring now to FIG. 8, there is illustrated a partial perspective view of the rearward end of the rectifier module 18. The rectifier module 18 includes a back plate 102 having a plurality of vent holes 104 formed therethrough. Mounting screws 106 are provided for mounting the back plate 102 to the housing 24. An input power connector 108, having AC contacts 110, is mounted to the rectifier module 18 for connecting AC power to the rectifier module 18. A data signal connector 112 and output power DC contacts 114 and 116 are also mounted to the rectifier module 18. The data signal connector 112 is preferably an RS 232 connector. The output power DC contacts 114 and 116 are preferably provided by standard spade-type contacts for mating with clip-type contacts which are mounted to bus bars. A module guide member hole 118 is formed into the back plate 102. Data signal connector guide pin sockets 120 are formed on each end of the data signal connector 112. Preferably, the input power connector 108, the signal connector 112 and the output power DC contacts 114 and 116 are rigidly mounted to the back plate 102 and the housing 24 of the rectifier module 18, such that they will not move for registering with mating connectors of one of the rectifier panels 16 and 18.

Figure 9:
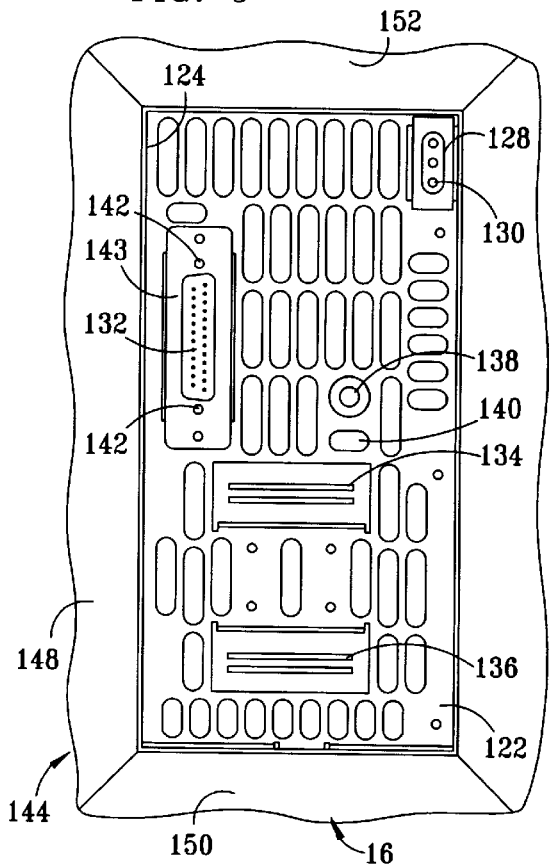
FIG. 9 illustrates a frontal perspective view of a mating plate of one of the rectifier panels.

Referring now to FIG. 9, there is illustrated a partial perspective view of a mating plate 122 of one of the rectifier panels 16. The mating plate 122 is provided for mating with components of the back plate 102 of the rectifier module 18. The mating plate 122 includes a plurality of vents holes 124.

A power connector 128 is mounted to the mating plate 122 and has a plurality of AC contacts 130 for mating with the AC contacts 110 of the input power connector 108 of the rectifier module 18. A data signal connector 132 is mounted to the mating plate 122 for mating with the signal connector 112. A plurality of power DC contacts 134 and 136 are preferably provided by clip-type contacts which will engage the output power DC contacts 114 and 116 of the module 18. A guide member 138 extends in a horizontal direction from the mating plate 122 for engaging within the module guide member hole 118. The guide member 138 is provided by a tapered guide pin. An alternate guide member mounting hole 140 is provided such that the guide member 138 may be mounted therein when the mating plate 122 is connected by power contacts 134 and 136 to a bus of a different output voltage than that which the mating plate 122, as shown, is configured for mating with. The data signal connector 132 has two spaced apart guide pins 142 located on opposite sides of the data signal connector 132. The connector guide pins 142 are tapered guide pins which extend horizontally from the data signal connector 132 for mating with the guide pin sockets 120 of the data signal connector 112 of the rectifier module 18.

The gather ability of the mating components extending from the back plate 102 of the rectifier module 12 and the mating plate 122 of the rectifier panel 16 is provided such that a slight misalignment will not interfere with respective ones of the connectors and contacts lining up during installation. The sidewalls of the housing 24 align the guide member 138 of the mating plate 122 for fitting within the guide member hole 118 of the module 18 to provide a gross alignment for aligning the DC spade contacts 114 and 116 with the DC clip contacts 134 and 136. A fine alignment for aligning the data signal connector 112 with the data signal connector 132 is provided by the connector guide pins 142 fitting within the signal connector guide pin sockets 120. The data signal connector 132 is mounted to the mating plate 122 such that it is movable to float slightly to align with the data signal connector 112 of the module 18 according to registration of the connector guide pins 142 within the signal connector guide pin holes 120. The guide pins 142 mount the data signal connector 132 to a plate 143, which connects to the mounting plate 122 such that plate 143 is movable over a limited range of motion relative to the mounting plate 122. The power connector 128 is moveable for a limited range of motion for aligning the AC contacts 130 with the AC contacts 110 of the input power connector 108 for supplying AC power to the rectifier module 18.

Figure 10:
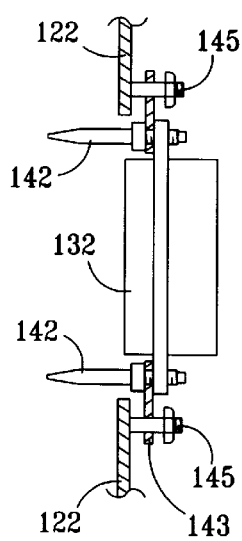
FIG. 10 illustrates partial, side elevational view depicting the mounting of the data signal connector to the rectifier cabinet.

Referring now to FIG. 10, there is illustrated a partial, sectional side elevational view of the plate 122 of the rectifier panel 144, which depicts the mounting of the data signal connector 132 thereto. The guide pins 142 are rigidly mounted to the connector 132. The connector 132 is rigidly mounted to a plate 143. The plate 143 is mounted to the mating plate 122 of the panel housing 144 by fasteners 145. The fasteners 154 allow the mounting plate 143 to move relative to the mating plate 122 such that there is a slight amount of movement to allow play for the data signal connector 132 to mate with the data signal connector 112 of the rectifier module 18. The fasteners 125 may slip relative to the mating plate 122 in the mounting plate 143 for a limited distance.

Figure 11:
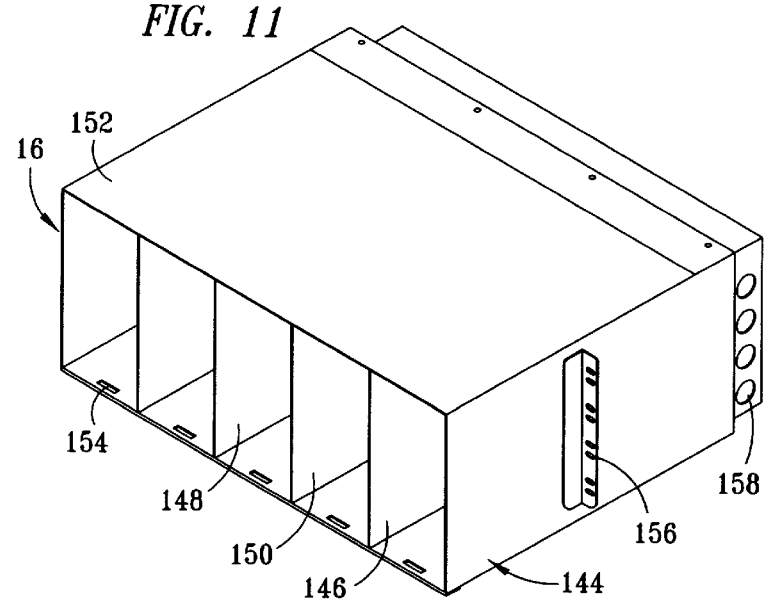
FIG. 11 illustrates a perspective view of a panel housing of one of the rectifier panels.

Referring now to FIG. 11, there is illustrated a perspective view of a panel housing 144 of one of the rectifier panels 16. The panel housing 144 includes five partially enclosed spaces which define five rectifier module bays 146 for receiving respective ones of the rectifier modules 18. The forward ends of the bays 146 are open. The rectifier module bays 146 are separated by partition plates 148 which mounted directly between a bottom plate 150 and a top plate 152 of the panel housing 144. Preferably, the partition plates 148 are provided by singular sheets of metal. Each of the rectifier bays 146 includes a latch slot 154 which extends through the bottom plate 150 for receiving a latch plate 140 (shown in FIG. 1). The forward end of the bottom plate 150 is folded-over, such that it has a double-walled thickness at the latch slot 154. The bottom of the latch plate 140 (shown in FIG. 1) will fit flush with the lower-most side of the bottom plate 150 to latch one of the modules 18 (shown in FIG. 1) into a respective one to the rectifier module bays 146. The housing 24 will fit within one of the rectifier module bays 146 with a slight clearance. Each of the rectifier modules bays 146 has one of the mating plates 122 disposed for matingly engaging with a back plate 102 of one of the rectifier modules 18. The panel housing 144 further includes a mounting bracket 156 for mounting the panel housing 144 within the rectifier cabinet 12. A plurality of cable ports are provided through a rearward flange of the panel housing 144.

Figure 12:
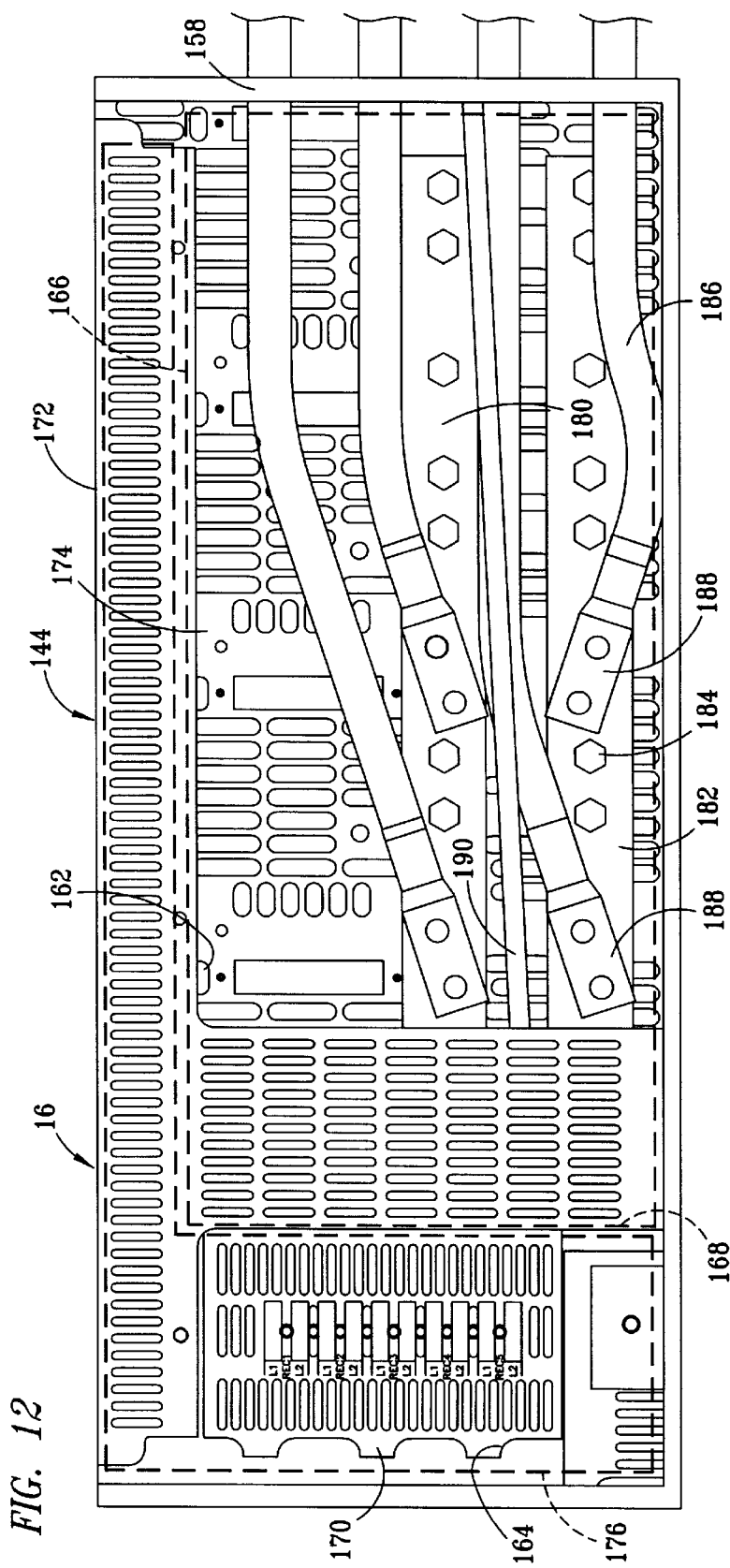
FIG. 12 illustrates a rear elevation view of the panel housing of the one of the rectifier panels.

Referring now to FIG. 12, there is illustrated a rear elevation view of the panel housing 144 of the one of the rectifier panels 16. The panel housing 144 includes an open, low voltage, rectified output compartment 162 and an enclosed AC power compartment 164. A barrier 166 and a barrier 168 extend on the sides of the low voltage compartment 162. A cover plate 170 is provided to cover the AC power compartment 164. The cover plate 170 fits flush with a back plate 172 of the panel housing 144. A mounting plate 174, which defines each of the mating plates 122 (shown in FIG. 9), extends beneath the AC power compartment 164. An AC vertical mounting plate 176 extends parallel to the mounting plate 174, and spaced apart therefrom such that bus bars 180 and 182 may be accessed with sufficient clearance for mounting the clip type DC contacts 134 and 136 thereto (shown in FIG. 9). A plurality of cables pass through the ports 158 and mount to intermediate portions of the buses 180 and 182 by being bolted thereto. The cables have connectors 188 for fastening the cables 186 to the respective one of the buses 180 and 182 with bolts.

A partition 190 extends between the buses 180 and 182 at an angle to the horizontal. The partition extends outward for several inches, such that a screw driver or other tool being used to connect components to the buses 180 and 182, and various other components of the panel 16, cannot bridge across and short the two buses 180 and 182. The partition 190 is canted to extend at an angle to the horizontal such that there will be clearance for passing cabling connectors 188 through the each of ports 158, and to allow the cabling connectors 188 to be connected to the upper bus 180, adjacent to the ports 158. The cabling connectors 188 require sufficient clearance for passing through the ports 158 on the bottom of the partition 190, and also require sufficient clearance for being secured above the partition to the bus 180. It should be noted that mounting the connectors 188 to intermediate positions of respective ones of the buses 180 and 182 provides that bus bars of a smaller size current capacity rating than that required for carrying the full current load of the panel 16 may be used, since the current flows to the center and not to one side of the bus bars 180 and 182. Thus, bus bars of a lower rated capacity and smaller physical size may be utilized to provide units which are of compact size.

In operation, one of the modules 18 may be removed from the cabinet 12 when a failure occurs. The switch 32 on the face plate is turned off. The latch knob 38 is rotated counterclockwise to release the knob 38 and the latch plate 40 from gripping the front plate 26 of the housing 24 therebetween. The latch plate 40 and the knob 38 are moved upwards such that the latch plate 40 will be cleared from the slot 154 and the module 18 may then be slid out of the forward end of one of the rectifier module bays 146 of one of the panel housings 144. If only the fan module 18 is to be replaced, the module 18 need only be moved forward a few inches until the tabs 58 and 60 clear the partition plates 148, such that the fasteners 84 may be released from engaging the housing 24 of the rectifier 18. The handle 33 may be gripped to pull the module 18 out of the forward end of one of the rectifier module bays 146. Moving the module 18 a few inches forward within the rectifier module bay 146 will electrically disconnect the module 18 from the panel housing 144, removing the connector 108 from the connector 128, removing the signal connector 112 from the signal connector 132, and removing the power output contacts 114 and 116 from respective ones of the contacts 134 and 136, which are connected to respective ones of the buses 184 and 186. Power will then be removed from the selected module 18.

If failure of the rectifier module 18 is due to a failure of the fan module 54, the fan module 54 may be replaced while the rectifier module 18 is only partially removed from the cabinet 12. The captive screws 84 are first released from securing the tabs 58 and 60 to the housing 24, then the fan module 54 may be slid out of the side of the housing 24 and removed form the rectifier module 18. Removal of the fan module from the rectifier module 18 disconnects the connector 74 from the connector 82, removing power from the fan and preferably electrically disabling the rectifier module 24 so that it cannot be inserted into the panel housing 144 and be powered up without the fan module 54 being installed. A new module 54 is installed in to the blind hole 44 of the housing 24 of the rectifier module 18. The fan module 54 is pushed inward with the upward and lower edges of the back plate 72 fitting between the four pairs of protuberances provided by the indentations 55, until the guide pin 78 mates with a guide pin hole 82 of the rectifier module 18. Then, the connector contacts 76 of the connector 74 are aligned for engaging with the contacts of the connector 82. The connector 74 of the module 54 is mated with the connector 82 of the rectifier module 18. The captive screws are then fastened to the housing 24. The rectifier module 18 is not enabled and cannot be inserted into one of the bays 146 of the panel housing 144 until the fan module 54 is fully inserted into the opening 44 of the housing 24. The captive screws 184 need to be fully engaged into the housing 144 with the rectifier module 18 such that they will clear the partition plates 148 and the rectifier module 18 may fit within one of the rectifier module bays 146.

During insertion of the rectifier module 18 into the rectifier module bay 146, the sidewalls of the housing 24 fit closely to respective ones of the partition plates 148, the top plate 152 and the bottom plate 150 of the panel 144, such that the guide pin member 148 fits within guide pin member hole 118. The contacts 114 and 116 will then engage within the clip contacts 134 and 136 to provide further alignment, such that the guide pins 142 of the connector 132 register with and fit within the guide pin holes 120 of the connector 112. The connector 132 will have a limited amount of play for aligning with the signal connector 112 which is rigidly secured to the back plate 102 of the rectifier module 18. Then, the AC power connector 128 will have a limited amount of movement for aligning with the connector 108 of the module 18 to connect power to the module 18 after the signal connector 112 is connected to the signal connector 132, and the output contacts 114 and 116 are connected to the contacts 134 and 136 of the panel housing 134. These connections will automatically align such that the connectors 108 and 112, and the contacts 114 and 116, will automatically register and mate with respective ones of the connectors 128, 132 and the output contacts 134 and 136. The contacts of the module 18 are self aligning with the components of the panel housing 144 of the rectifier module bay 146. The components mounted to the back plate 102 are then matingly engaged with the components mounted to the back plate 122, such that the rectifier module 18 may be operated. The switch 32 on the face plate of the module 18 is then turned back on.

The disclosed embodiment provides several advantages over prior rectifier cabinets. Rectifier modules are provided which are self aligning such that they will blind mate with the rectifier panels during installation into the rectifier cabinets. The sidewalls of the housing of the rectifier modules are sized such that they are close fitting with the walls of the bays of the rectifier panels to align a guide pin member for insertion into a guide pin member hole. This aligns the DC input and output contacts, which aligns the AC input and output contacts, and the data signal connector guide pins for insertion into guide pin sockets which aligns the data signal connectors. A flush type latch is provided which does not occupy excess space, such that a higher value of rectified output wattage per unit space is obtained to provide compactness. Rectifier modules are provided with replaceable fan units. The replaceable fan units are mounted to fan module which may be removed after the rectifier modules are moved but a few inches outward from their positions within the cabinets. Moving the rectifier modules outward a few inches to allow removal of the fan modules from the rectifier panels serves to disconnect power from the rectifier modules prior to access for removal of the fan modules such that the rectifier modules cannot be powered up and subsequently overheated. Removal of the fan modules from the rectifier modules disables the rectifiers modules from being powered up. The rectifier modules may be hot swapped and the fans replaced while the remainder of the rectifier modules remain in operation to provide rectified power output from the power rectifier cabinet.

Although the preferred embodiment has been described in detail, it should be understood that various changes, substitutions and alterations can be made therein without departing from the spirit and scope of the invention as defined by the appended claims.

What is claimed is:

1. An interconnect for engaging a rectifier module with a rectifier cabinet, comprising in combination:

a first portion having DC input contacts, AC output contacts, a cabinet data signal connector and sidewalls which define a respective one of an at least partially enclosed space of said rectifier cabinet;

a second portion having DC output contacts, AC input contacts, a module data signal connector and a housing which encloses a rectifier unit;

a guide member mounted to one of said first and second portions;

a guide member hole mounted to the other of said first and second portions, wherein said guide member and said guide member hole are aligned for matingly engaging when said housing is inserted into said at least partially enclosed space and engages said sidewalls thereof;

a pair of signal connector guide pin members mounted to one of said module data signal connector and said cabinet data signal connector for being received in respective ones of a pair of guide pin sockets of the other one of said module data signal connector and said cabinet data signal connector, such that said module data signal connector and said cabinet data signal connector are aligned for mating engagement therebetween;

one of said module data signal connector and said cabinet data signal connector being movably attached to a respective one of said housing and said cabinet for moving to matingly engage with the other of said module data signal connector and said cabinet data signal connector; and wherein inserting said rectifier module within said at least partially enclosed space engages said housing with said sidewalls, which aligns said guide member for engagement with said guide member hole to align said DC output contacts with said DC input contacts, which together align said AC input contacts with said AC output contacts and said signal connector guide pins with said signal connector guide pin sockets to align said module data signal connector with said cabinet data signal connector.

2. The interconnect of claim 1, wherein said guide pin members are mounted to said cabinet data signal connector and said guide pin holes are mounted to said module data signal connector.

3. The interconnect of claim 1, further comprising:
one of said sidewalls of said partially enclosed space having a slot disposed on a forward portion thereof;
a latch member moveably mounted to said housing of said rectifier module for engaging within said slot when said housing of said rectifier module is fully engaged within said at least partially enclosed space of said rectifier cabinet; and
said latch member being sized for fitting flush with an opposite side of said one of said sidewalls when said latch member is fully engaged within said slot.

4. The interconnect of claim 3, wherein said latch member is moveable for extending and retracting in lineal directions.

5. The interconnect of claim 4, wherein said one of said sidewalls having said slot is defined by a singular sheet of metal.

6. The interconnect of claim 5, wherein said forward portion of said one of said sidewalls having said slot is defined by folding a forward end of said singular sheet of metal into a doubled layer.

7. The interconnect of claim 1, wherein said guide member hole and said pair of signal connector guide pin sockets are disposed on said rectifier module, and said guide member and said signal connector guide pins are mounted to one of said sidewalls of said at least partially enclosed space.

8. The interconnect of claim 1, wherein said DC input contacts, AC output contacts and said cabinet data signal connector are mounted to a rearwardly disposed one of said sidewalls of said at least partially enclosed space; and
wherein said DC output contacts, said AC input contacts and said module data signal connector are mounted to a rearward side of said housing.

9. The interconnect of claim 1, further comprising:
one of said sidewalls of said at least partially enclosed space having a slot disposed on a forward portion thereof;
said rectifier module having a latch member moveably mounted to said housing of said rectifier module for engaging within said slot when said rectifier module is fully engaged within said at least partially enclosed space of said rectifier cabinet;
said latch member being sized for fitting flush with an opposite side of said one of said sidewalls when said latch member is fully engaged within said slot;
said latch member being moveable for extending and retracting in lineal directions;
said DC input contacts, AC output contacts, said cabinet data signal connector and said guide member being mounted to a rearward one of said sidewalls of said at least partially enclosed space; and
said DC output contacts, said AC input contacts, said module data signal connector and said guide member hole being disposed on a rearward side of said housing.

10. A rack mounted rectifier cabinet, comprising:
a plurality of at least partially enclosed spaces for receiving respective ones of rectifier modules, each of said at least partially enclosed spaces having DC input contacts, AC output contacts, a cabinet data signal connector and sidewalls which define a respective one of said at least partially enclosed spaces;
said rectifier modules, each having a rectifier unit, DC output contacts, AC input contacts, a module data signal connector and a housing which encloses a rectifier unit;
a plurality of guide members, each mounted to a respective one of said rectifier modules and said at least partially enclosed spaces, for being received in a respective guide member hole of a respective one of said rectifier modules and said at least partially enclosed spaces for aligning said housing within said at least partially enclosed spaces for engaging said DC output contacts with said DC input contacts;
a plurality of signal connector guide pin members, each mounted to a respective one of said module data signal connectors and said cabinet data signal connectors for being received in a respective guide pin socket of a respective one of said module data signal connectors and said cabinet data signal connectors, to align said respective module data signal connector for mating with said respective cabinet data signal connector;
wherein corresponding ones of said module data signal connectors and said cabinet data signal connectors are moveably attached to a respective one of said housing and said cabinet for providing tolerance for matingly engaging with the other ones of said module data signal connectors and said cabinet data signal connectors; and
wherein engagement of the housings of said rectifier modules with respective ones of said sidewalls of said at least partially enclosed spaces aligns said guide members in respective ones of said guide member holes and engages said DC output contacts with said DC input contacts, which together aligns said AC input contacts with said AC output contacts and said signal connector guide pins with said signal connector guide pin sockets for mating engagements therebetween.

11. The rectifier cabinet of claim 10, wherein said guide members are mounted to respective ones of said at least partially enclosed spaces of said cabinet and said guide member holes are disposed on respective ones of said housings of said rectifier modules.

12. The rectifier cabinet of claim 10, further comprising:
one of said sidewalls of each of said at least partially enclosed spaces including a slot disposed on a forward end thereof;

a latch member moveably mounted to each of said housings of said rectifier modules for engaging within a corresponding one of said slots of said sidewalls when a respective one of said rectifier modules is fully engaged within said rectifier cabinet; and said latch member being sized for fitting flush with an opposite side of the respective one of said sidewall when fully engaged within said corresponding one of said slots.

13. The rectifier cabinet of claim 12, wherein said latch member is moveable for extending and retracting in lineal directions.

14. The rectifier cabinet of claim 13, further comprising:

a plurality of rectifier panels, each including a plurality of said at least partially enclosed spaces for receiving a plurality of said rectifier modules; and said sidewalls of said at least partially enclosed spaces being defined by singular sheets of metal, wherein adjacent ones of said at least partially enclosed spaces are separated by respective ones of said singular sheets of metal.

15. The rectifier cabinet of claim 14, where in said slots for receiving said latch members are formed into forward portions of respective ones of said sidewalls, which are defined by said singular sheets of metal, said forward portions of said sidewalls have a doubled portions of said singular sheets for metal which are formed to fold into a double layer at said forward portions thereof.

16. The rectifier cabinet of claim 10, wherein said guide member holes and said signal connector guide pin sockets are mounted to respective ones of said rectifier modules, and said guide members and said signal connector guide pin members are mounted to respective ones of said at least partially enclosed spaces.

17. The rectifier cabinet of claim 10, wherein said DC input contacts, AC output contacts and said cabinet data signal connector are mounted to rearward ones of said sidewalls of respective ones of said at least partially enclosed spaces; and wherein said DC output contacts, said AC input contacts, said module data signal connector are mounted to a rearward side of said housing.

18. The rectifier cabinet of claim 10, further comprising:

wherein said guide members are mounted to respective ones of said at least partially enclosed spaces of said cabinet and said guide member holes are mounted to respective ones of said rectifier module housings;

wherein one of said sidewalls of each of said at least partially enclosed spaces includes a slot disposed on a forward end thereof;

said rectifier modules further include a latch member moveably mounted to each of said rectifier modules for engaging within a corresponding one of said slots of said sidewalls when a respective one of said rectifier modules is fully engaged within said rectifier cabinet;

said latch member being sized for fitting flush with an opposite side of the respective one of said sidewall when fully engaged within said corresponding one of said slots;

wherein said latch member is moveable for extending and retracting in lineal directions;

a plurality of rectifier panels, each including a plurality of said at least partially enclosed spaces for receiving a plurality of said rectifier modules;

said sidewalls of said at least partially enclosed spaces being defined by singular sheets of metal, wherein adjacent ones of said at least partially enclosed spaces are separated by respective ones of said singular sheets of metal;

wherein said slots for receiving said latch members are formed into forward portions of respective ones of said sidewalls, which are defined by said singular sheets of metal, said forward portions of said sidewalls have a doubled portions of said singular sheets for metal which are formed to fold into a double layer at said forward portions thereof;

wherein said guide members and said signal connector guide pin sockets are mounted to respective ones of said rectifier modules, and said guide holes and said signal connector guide pin members are mounted to respective ones of said at least partially enclosed spaces;

wherein said DC input contacts, AC output contacts and said cabinet data signal connector are mounted to rearward ones of said sidewalls of respective ones of said at least partially enclosed spaces; and wherein said DC output contacts, said AC input contacts, said module data signal connector are mounted to a rearward side of said housing.

19. A method for installing a rectifier module in a rectifier cabinet having an AC input and a DC output, comprising the steps of:

providing an interconnect having two interconnect halves, a first of which includes DC input contacts, AC output contacts and a first data signal connector for mating with respective ones of DC output contacts, AC input contacts and a second data signal connector, which are included in a second of the two interconnect halves, and providing the interconnect to further include a guide member mounted to one of first and second interconnect halves and a guide member hole for receiving the guide member mounted to the other of the first and second interconnect halves, and the first and second data signal connectors having signal connector guide pin members and signal connector guide pin sockets for engaging therebetween to align the first and second signal connectors for interconnecting therebetween;

providing the rectifier cabinet with sidewalls which define an at least partially enclosed space and a housing for the rectifier module with sides which closely fit within the sidewalls of the at least partially enclosed space mounting the first interconnect half to the rectifier module and the second interconnect half to the rectifier cabinet;

inserting the rectifier module into the at least partially enclosed space of the rectifier cabinet; and wherein the closely fitting relationship between the housing of the rectifier module and the sidewalls of the at least partially enclosed space aligns the guide member for inserting into the guide member hole by rearward movement of the housing of the rectifier module into the at least partially enclosed space, which aligns the DC output contacts and the DC input contacts for mating engagement therebetween, which aligns the AC input contacts with the AC output contacts and the signal connector guide pin members with the signal connector guide pin sockets, which aligns the first and second signal connectors for interconnecting therebetween.

20. The method of claim 19, further comprising the step of:

latching the rectifier module within the at least partially enclosed space of the cabinet by slidably moving a latch member in a lineal direction from the rectifier module into a slot formed into a sidewall portion of the at least partially enclosed space of the rectifier cabinet, until a terminal end portion of said latch member is flush with an opposite side of the sidewall from a side on which the rectifier module is disposed.

* * * * *